(12) United States Patent
Jouin et al.

(10) Patent No.: US 9,317,095 B1
(45) Date of Patent: *Apr. 19, 2016

(54) VOLTAGE SCALING SYSTEM SUPPORTING SYNCHRONOUS APPLICATIONS

(75) Inventors: Sebastien Jouin, La Chapelle Launay (FR); Romain Oddoart, Petit Mars (FR); Patrice Menard, Saint-Mars-du-Desert (FR); Mickael Le Dily, Carquefou (FR); Thierry Gourbilleau, Le Loroux-Bottereau (FR)

(73) Assignee: Atmel Corporation, San Jose, CA (US)

( * ) Notice: Subject to any disclaimer, the term of this patent is extended or adjusted under 35 U.S.C. 154(b) by 542 days.

This patent is subject to a terminal disclaimer.

(21) Appl. No.: 13/614,467

(22) Filed: Sep. 13, 2012

(51) Int. Cl.
*G06F 1/32* (2006.01)
*H03K 19/003* (2006.01)

(52) U.S. Cl.
CPC ............ *G06F 1/3203* (2013.01); *G06F 1/3206* (2013.01); *H03K 19/00346* (2013.01)

(58) Field of Classification Search
USPC ...................................... 713/1, 300; 365/228
See application file for complete search history.

(56) References Cited

U.S. PATENT DOCUMENTS

| | | | |
|---|---|---|---|
| 5,337,284 A | | 8/1994 | Cordoba et al. |
| 5,471,432 A | * | 11/1995 | Makihara .................... 365/233.5 |
| 5,568,083 A | | 10/1996 | Uchiyama et al. |
| 5,936,455 A | | 8/1999 | Kobayashi et al. |
| 6,175,531 B1 | * | 1/2001 | Buck et al. ..................... 365/226 |
| 6,195,298 B1 | | 2/2001 | Furutani et al. |
| 6,348,833 B1 | | 2/2002 | Tsujimoto et al. |
| 6,457,082 B1 | | 9/2002 | Zhang et al. |
| 6,956,429 B1 | | 10/2005 | Elbanhawy |
| 7,755,410 B2 | | 7/2010 | Oh et al. |
| 8,575,997 B1 | | 11/2013 | Le Dily et al. |
| 2002/0126561 A1 | * | 9/2002 | Roohparvar ................... 365/226 |
| 2003/0210026 A1 | | 11/2003 | Clark |
| 2004/0181643 A1 | * | 9/2004 | Micheloni et al. ............. 711/167 |
| 2005/0218871 A1 | | 10/2005 | Kang et al. |
| 2005/0223259 A1 | * | 10/2005 | Lehwalder et al. ............ 713/330 |
| 2007/0115044 A1 | | 5/2007 | Chan et al. |
| 2007/0274148 A1 | * | 11/2007 | Nitta et al. ..................... 365/226 |
| 2008/0049505 A1 | * | 2/2008 | Kim et al. ................. 365/185.11 |

(Continued)

OTHER PUBLICATIONS

U.S. Appl. No. 13/592,173, Restriction Requirement mailed May 9, 2013.
U.S. Appl. No. 13/592,173, Notice of Allowance mailed Jul. 2, 2013.
U.S. Appl. No. 14/042,303, Non-Final OA dated May 28, 2014 (10 pages).

(Continued)

*Primary Examiner* — Kim Huynh
*Assistant Examiner* — Brandon Kinsey
(74) *Attorney, Agent, or Firm* — Fish & Richardson P.C.

(57) ABSTRACT

A voltage scaling system can scale a supply voltage while preventing a processor from communicating with first system components that are rendered unstable from the scaling. On the other hand, the voltage scaling system allows second system components that are stable during the scaling to communicate with the processor. A processor scales a system supply voltage to a target supply voltage. The processor halts operations of the first system components and executes the instruction. When the first system components are halted, the processor cannot access the first system components. The second system components can continue operating during the scaling. A controller that saves power can configure a voltage regulator to scale the system supply voltage to the target supply voltage. Once the target supply voltage is reached, the voltage regulator sends an indication to a power management unit, after which the first system components continue to operate.

21 Claims, 3 Drawing Sheets

(56) References Cited

U.S. PATENT DOCUMENTS

| | | |
|---|---|---|
| 2008/0067998 A1 | 3/2008 | Lee et al. |
| 2011/0157976 A1 | 6/2011 | Kuriyama |
| 2011/0235457 A1 | 9/2011 | Hirata |
| 2013/0166934 A1* | 6/2013 | Chu .............................. 713/323 |

OTHER PUBLICATIONS

U.S. Appl. No. 14/042,303, Final Office Action dated Nov. 13, 2014, 11 pages.

U.S. Appl. No. 13/614,468, Non-Final OA dated Apr. 20, 2015.

* cited by examiner

VOLTAGE SCALING SYSTEM SUPPORTING SYNCHRONOUS APPLICATIONS

TECHNICAL FIELD

This disclosure relates generally to electronics and more particularly to voltage scaling systems.

BACKGROUND

A system can use a voltage regulator to scale supply voltages. The voltage regulator maintains a constant voltage level until instructed to supply a different voltage level. Generally, transitioning from a voltage value to a lower voltage value can take a significantly longer time than transitioning from the voltage value to a higher voltage value.

By decreasing supply voltages, the system can achieve lower power consumption. When the system dynamically changes a supply voltage, certain operations should be halted until the supply voltage is stabilized. For example, Flash memory data fetches should be halted until the Flash memory is recalibrated with the updated voltage supply value. The time required to stabilize the voltage is generally unpredictable and can have a negative impact on system latency.

SUMMARY

A voltage scaling system can scale a supply voltage while preventing a processor from communicating with first system components that are rendered unstable from the scaling. On the other hand, the voltage scaling system allows second system components that are stable during the scaling to communicate with the processor. A processor receives an instruction to scale a system supply voltage to a target supply voltage. The processor halts operations of the first system components and executes the instruction. When the first system components are halted, the processor cannot access the first system components, e.g., Flash memory data. The second system components, e.g., synchronous applications that do not require access to Flash memory data, can continue operating during the scaling. A controller that saves power can configure a voltage regulator to scale the system supply voltage to the target supply voltage. Once the target supply voltage is reached, the voltage regulator sends an indication to a power management unit, after which the first system components continue to operate.

Particular implementations of the voltage scaling system can provide one or more of the following advantages: 1) the voltage scaling system can halt communication between the processor and the first system components while a system supply voltage is transitioning; and 2) the processor can communicate with second system components while the system supply voltage is transitioning thereby decreasing latency for certain operations.

The details of one or more disclosed implementations are set forth in the accompanying drawings and the description below. Other features, aspects, and advantages will become apparent from the description, the drawings and the claims.

DETAILED DESCRIPTION

Example Voltage Scaling System

Figure 1:
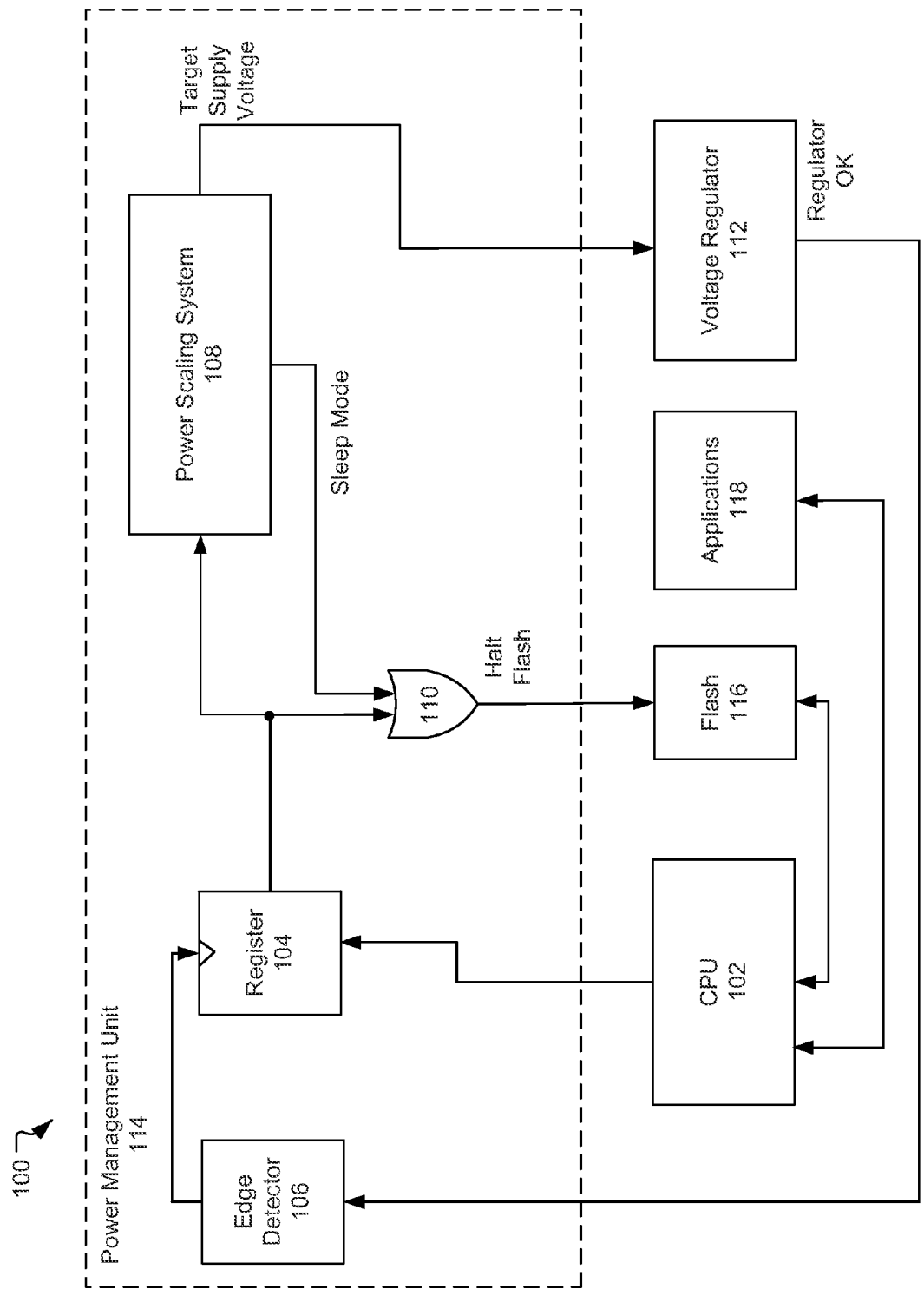
FIG. 1 is a schematic diagram of an example voltage scaling system.

FIG. 1 is a schematic diagram of an example voltage scaling system 100. The voltage scaling system 100 includes a power management unit 114. The power management unit 114 can act as a controller that saves power for the voltage scaling system 100. The voltage scaling system 100 also includes a central processing unit (CPU) 102. The CPU 102 executes instructions of a computer program. The CPU 102 can communicate with the power management unit 114.

In particular, the CPU 102 can set a register 104 in the power management unit 114 to high, which would start voltage scaling for the system 100. The register 104 can be a control bit that tracks whether the CPU 102 is requesting a voltage scaling. The CPU 102 can drive the register 104 based on received instructions from the computer program. If the register 104 is high, the voltage scaling system 100 is or will be transitioning the system supply voltage. If the register 104 is low, the voltage scaling system 100 is not transitioning the system supply voltage.

The voltage scaling system 100 includes one or more first system components that are rendered unstable during the voltage scaling. The first system components are sensitive to a system supply voltage and need to be recalibrated if the system supply voltage changes. That is, the first system components are stable when the system supply voltage is constant, but are unstable when the system supply voltage is transitioning. An example of a first system component is Flash memory data 116. The Flash memory data 116 can store instructions of the CPU 102. In some implementations, the CPU 102 fetches the instructions from the Flash memory data 116. During voltage scaling, the Flash memory data 116 is unstable, e.g., the Flash internals are not calibrated with a current system supply voltage. Therefore, the CPU 102 should not access or communicate with the Flash memory data 116 during the voltage scaling. Other first system components that are rendered unstable during the voltage scaling include analog converters, e.g., analog to digital convertors or analog comparators, and internal oscillators.

The voltage scaling system 100 includes one or more second system components that are stable during the voltage scaling. The second system components are stable regardless of whether the system supply voltage is transitioning. For example, second system components can be applications 118. The applications 118 can be digital synchronous modules that use their own clocks for proper operation. As will be described below, the CPU 102 is halted during voltage scaling and therefore cannot fetch instructions from the first system components. As a result, the applications 118 can run standalone without any CPU intervention. The applications 118 can include a calendar application or direct memory access.

The voltage scaling system 100 includes a voltage regulator 112. The voltage regulator 112 provides a system supply voltage to the voltage scaling system 100 and other systems coupled to the system supply voltage, e.g., a third party system. The voltage regulator 112 can receive a target supply voltage from a power scaling system 108. The power scaling system 108 can obtain the target supply voltage from a user interface and provide the target supply voltage to the voltage regulator 112 before scaling the system supply voltage. For example, the power scaling system 108 can provide the target supply voltage upon detecting the register 104 is high.

The voltage regulator 112 can execute a power scaling sequence to transition the system supply voltage to the target supply voltage. The voltage regulator 112 can provide an indication to an edge detector 106 when the system supply voltage has finished transitioning to the target supply voltage. The indication will be described further below in reference to FIG. 2.

The power management unit 114 includes an edge detector 106. The edge detector processes, as input, the indication sent from the voltage regulator 112. When the system supply voltage finishes transitioning, the indication can be a signal that transitions from low to high. Based on the indication, the edge detector 106 can clear the register 104.

The power scaling system 108 of the power management unit 114 can control an operating mode for each of the one or more first system components that are rendered unstable during a voltage scaling. For example, the operating mode can be represented by a sleep mode signal from the power scaling system 108 to the one or more first system components. When start operating in a sleep mode, system components are halted, e.g., are rendered inactive. The power scaling system 108 can enable the sleep mode signal, e.g., set the sleep mode signal as high, based on an instruction from the CPU 102 to reduce current consumption. On the other hand, the power scaling system 108 can disable the sleep mode signal, e.g., set the sleep mode signal as low, when the CPU 102 accesses the one or more first system components. In some implementations, the sleep mode signal acts as the operating mode for all of the first system components.

The power management unit 114 includes an OR gate 110. The OR gate 110 can have two inputs: 1) output of the register 104, and 2) an operating mode provided by the power scaling system 108. Output of the OR gate 110 can control operation of the one or more first system components, which will be described further below in reference to FIG. 2.

In some implementations, the power scaling system 108 and the first input of the OR gate 110 consider both the output of the register 104 and a synchronous enable signal. The synchronous enable signal 108 can be enabled or disabled by a user, e.g., by setting or clearing another register. The synchronous enable signal 108 allows the user to activate or deactivate the power scaling mechanism that halts the one or more first system components. For example, if the synchronous enable signal is enabled, the Flash memory data 116 can be halted if the register 104 is high. On the other hand, if the synchronous enable signal is low, the Flash memory data 116 is not halted even if the register 104 is high. In some implementations, the output of the register 104 and the synchronous enable signal are inputs to an AND gate, the output of which is coupled to the power scaling system 108 and coupled to the first input of the OR gate 110.

Example Voltage Scaling System Flowchart

Figure 2:
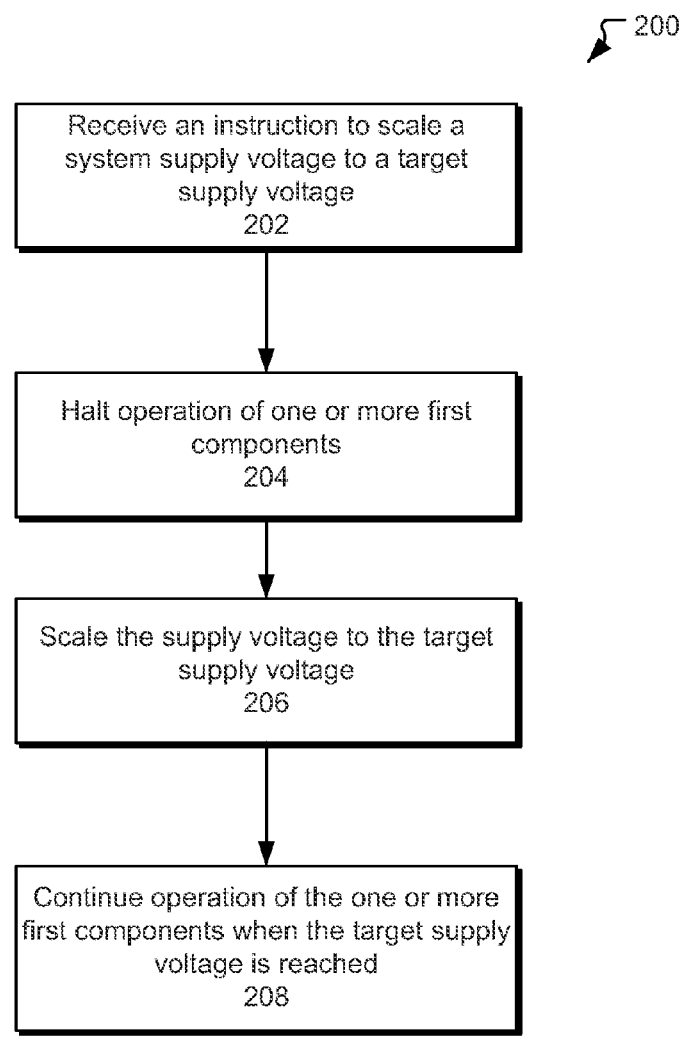
FIG. 2 is a flow diagram of an example process performed by a voltage scaling system.

FIG. 2 is a flow diagram of an example process performed by a voltage scaling system, e.g., the voltage scaling system 100 described above in reference to FIG. 1. A voltage scaling system 100 can receive instructions, e.g., from a user interface, a third party system, or Flash memory, to downscale or upscale voltage using a voltage regulator 112 (step 202). The instructions can include a target supply voltage for the voltage regulator 112. Upon receiving the instructions, the voltage scaling system 100 uses a CPU 102 to set a register 104 as high to start a voltage scaling sequence.

When output of the register 104 is high, the voltage scaling system 100 halts operation of one or more first components (step 204). As described above, the first components are system components that are rendered unstable when the voltage regulator 112 is scaling a supply voltage to the target supply voltage. Because a first input of an OR gate 110 is coupled to the output of the register 104, output of the OR gate 110 is high if the output of the register 104 is high. The output of the register 104 can also be coupled to the power scaling system 108, which can configure operating modes of the one or more first components, as described above in reference to FIG. 1. In some implementations, upon determining the output of the register 104 is high, the power scaling system 108 sends a high sleep mode signal to the one or more first components through the OR gate 110. In some other implementations, the sleep mode signal operates independently from the output of the register 104. For example, the sleep mode signal can be set to high if the power scaling system 108 receives an instruction to reduce power consumption.

The output of the OR gate 110 can indicate whether to halt the one or more first components. If either the output of the register 104 is high or if the sleep mode signal is high, the output of the OR gate 110 will be high. If the output of the OR gate 110 is high, the one or more first components, e.g., Flash memory data 116, are halted, thereby preventing a CPU 102 from accessing the one or more first components. If the output of the OR gate 110 is low, the one or more first components is no longer halted, thereby enabling a CPU 102 to access the one or more first components.

A power management unit 114 controls operation of the voltage regulator 112. As described above in reference to FIG. 1, the power scaling system 108 of the power management unit 114 can provide the target supply voltage to the voltage regulator 112. The voltage regulator 112 then scales the system supply voltage to the target supply voltage (step 206).

During the voltage scaling, one or more second components can continue operating while the CPU 102 is halted. As described above, the second components are system components that are able to operate standalone without CPU intervention and are not rendered unstable during the voltage scaling. For example, the second components can be synchronous components running on their own clocks but do not need one or more of the first components to function. For example, an alarm application can use its own clock but does not require Flash memory data 116 to function.

Once the voltage regulator 112 reaches the target supply voltage, the voltage regulator 112 sends an indication to an edge detector 106 of the power management unit 114. Before the target supply voltage is reached, the indication can be a low "regulator OK" signal. After the target supply voltage is reached, the indication can transition to a high "regulator OK" signal. The edge detector 106 can detect a rising edge of the "regulator OK" signal and clear the register 104 based on the detection. When the register 104 is cleared, the output of the register 104, and, therefore, the first input to the OR gate 110 is low. In some implementations, the output of the register 104 causes the power scaling system 108 to set the sleep mode signal as low. If both the sleep mode and the output of the register 104 are low, the output of the OR gate 110 is low, and the signal to halt the one or more first components is low. Based on the low signal, the voltage scaling system 100 no longer halts operations of the one or more first components, and the CPU 102 can restart operating the one or more first components (step 208).

Example Timing Diagram

Figure 3:
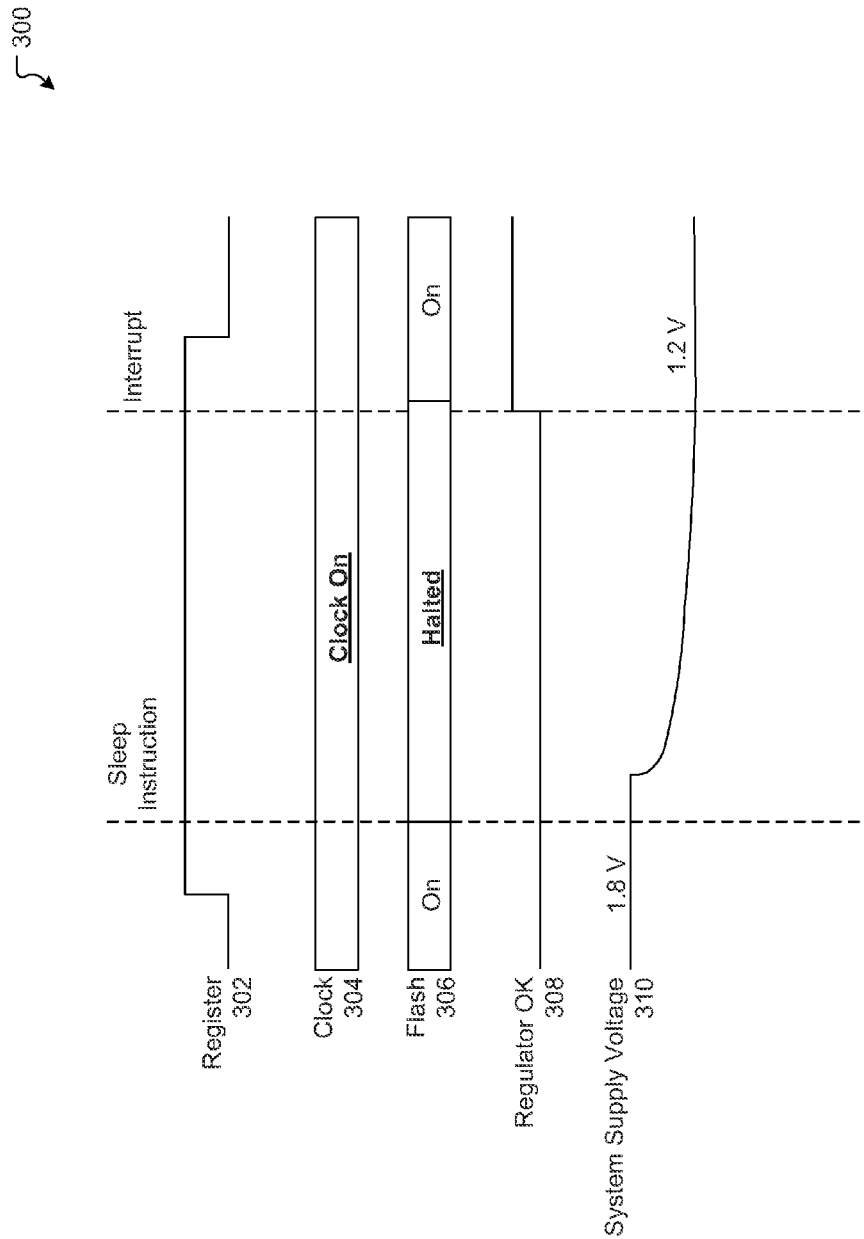
FIG. 3 is an example timing diagram of a voltage scaling system that receives an instruction to downscale a system supply voltage.

FIG. 3 is an example timing diagram 300 of a voltage scaling system that receives an instruction to downscale a system supply voltage. For example, the instruction can be to downscale the system supply voltage from 1.8 Volts to a target supply voltage of 1.2 Volts. If the instruction is to upscale the system supply voltage, the diagram 300 described below generally applies with the exception of the system supply voltage 312 graph, e.g., the system supply voltage graph 310 will start at a low voltage and transition to a high voltage.

Once the voltage scaling system receives the instruction to downscale, a register 302 becomes high. A clock 304 of a CPU and Flash memory 306 are both on. A "regulator OK" signal 308 is low. A system supply voltage 310 is high, e.g., 1.8 Volts.

The CPU can execute a sleep instruction for the components that are rendered unstable due to the downscaling. At that point, the Flash memory data 306 can be halted. Because the register 302 is high, output of an OR gate, e.g., the OR gate describe above in reference to FIGS. 1 and 2, is high, thereby halting operation of the Flash memory data 306. The voltage regulator, based on the received instruction, starts downscaling the system supply voltage 312. As shown in the diagram, downscaling the system supply voltages occurs gradually and not instantaneously, and the Flash memory data 306 is halted during the downscaling. If the Flash memory data 306 is halted, the CPU is unable to fetch its data, e.g., instructions in Flash memory. While the Flash memory data 306 is halted, the clock 304 is still on. This allows other components that do not require Flash 306 to run standalone.

As soon as the voltage regulator reaches the target supply voltage, e.g., 1.2 Volts, the voltage regulator sends a high "regulator OK" signal 308, e.g., acting as an interrupt, to an edge detector. The edge detector detects a rising edge of the "regulator OK" signal and clears the register 302, e.g., sets the register 302 to low.

When the register 302 is low, output of the OR gate is low. Assuming a power scaling system does not run the Flash memory data 306 in sleep mode, e.g., the second input to the OR gate is low as described above in reference to FIG. 1, output of the OR gate is low. Therefore, the Flash memory data 306 continues operating, allowing the CPU to access, e.g., fetch instructions, from the Flash memory data 306.

Even though the timing diagram 300 describes halting operation of the Flash memory data 306, the system described can also halt operations of other components that are rendered unstable during a voltage scaling.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method performed by a circuit for scaling voltage, the method comprising:
   receiving an instruction to scale a system supply voltage to a target supply voltage;
   in response to receiving the instruction, setting a register to a first value;
   based on the register being set to the first value, halting operations of one or more first components, wherein halting the operations comprises:
      receiving an output of the register at a power scaling system;
      in response to the register being set to the first value, enabling, by the power scaling system, a sleep mode signal that is configured to halt the operations of the one or more first components;
      receiving, at a gate circuit, at least one of the output of the register or an operating mode output by the power scaling system; and
      in response to the register being set to the first value or the operating mode output by the power scaling system being the enabled sleep mode signal, outputting, by the gate circuit, a signal that is configured to halt the operations of the one or more first components;
   scaling the system supply voltage to the target supply voltage;
   when the target supply voltage is reached, setting the register to a second value; and
   based on the register being set to the second value, resuming operations of the one or more first components.

2. The method of claim 1, further comprising:
   operating with one or more second components during the voltage scaling, where the one or more second components are stable during the voltage scaling.

3. The method of claim 2, where the one or more second components includes one or more direct memory access, a calendar module, or other synchronous modules.

4. The method of claim 2, where the operating comprises executing instructions from the one or more second components using a respective clock of the one or more second components.

5. The method of claim 1, where the instruction is sent by a user through a user interface.

6. The method of claim 1, where scaling the system supply voltage to the target supply voltage comprises using a voltage regulator to scale the system supply voltage to the target supply voltage, the method further comprising:
   when the target supply voltage is reached, sending, by the voltage regulator, an indication the target supply voltage is reached; and
   detecting, by an edge detector, an indication that the target supply voltage is reached.

7. The method of claim 1, where the one or more first components include at least one of Flash memory, analog converters, or internal oscillators.

8. A system for scaling voltage, comprising:
   a processor, where the processor is configured to receive an instruction to scale a system supply voltage to a target supply voltage;
   one or more first components, where operations of the one or more first components are halted during the voltage scaling; and
   a controller that includes:
      a register that is configured to enable the voltage scaling for the system, where the register is configured to be set to a first value upon receipt of the received instruction and to a second value otherwise, where the operations of the one or more first components are halted based on the register being set to the first value;
      a power scaling system that provides an operating mode based on an output of the register, where the operating mode configures the operations of the one or more first components; and a gate circuit having the output of the register as a first input and the operating mode as a second input, where an output of the gate circuit determines whether the operations of the one or more first components are resumed or halted, wherein the controller is configured to:
receive a control signal from the processor to set the register to the first value in response to the instruction to scale the system supply voltage to the target supply voltage;
control a voltage regulator to scale the system supply voltage to the target supply voltage;
receive an indication from the voltage regulator when the target supply voltage is reached; and
set the register to the second value when the target supply voltage is reached, where the operations of the one or more first components are resumed based on the register being set to the second value.

9. The system of claim 8, where the controller is configured to provide the target supply voltage to the voltage regulator.

10. The system of claim 8, where the one or more first components include at least one of Flash memory, analog converters, or internal oscillators.

11. The system of claim 8, further comprising one or more second components, where the one or more second components are stable during the voltage scaling, and where the one or more second components are configured to operate with a respective clock of the one or more components during the voltage scaling.

12. The system of claim 11, where the one or more second components includes one or more of direct memory access, a calendar module, or other synchronous modules.

13. The system of claim 8, where the controller further includes:
an edge detector, where the edge detector detects the indication from the voltage regulator when the target supply voltage is reached.

14. The system of claim 8, where the operations of one or more first components are halted if the output of the gate circuit is at a first level, and the operations of the one or more first components are resumed if the output of the gate circuit is at a second level.

15. The system of claim 13, where the edge detector is configured to set the register to the second value upon the detection, and where the edge detector detects a rising edge of the indication.

16. The system of claim 8, where the processor is prevented from fetching instructions from the one or more first components when the operations of the one or more first components are halted.

17. The method of claim 1, where the first value includes a register bit being set, and the second value includes the register bit being cleared.

18. The system of claim 8, where the first value includes a register bit being set, and the second value includes the register bit being cleared.

19. The system of claim 8, where the power scaling system is configured to output an enabled sleep mode signal as the operating mode in response to the register being set to the first value, where the enabled sleep mode signal is configured to halt the operations of the one or more first components.

20. The method of claim 1, where the gate circuit includes an OR gate.

21. The system of claim 8, where the gate circuit includes an OR gate.

* * * * *